United States Patent
Schmitz et al.

(10) Patent No.: US 6,255,183 B1
(45) Date of Patent: Jul. 3, 2001

(54) MANUFACTURE OF A SEMICONDUCTOR DEVICE WITH A MOS TRANSISTOR HAVING AN LDD STRUCTURE USING SIGE SPACERS

(75) Inventors: Jurriaan Schmitz; Youri V. Ponomarev; Pierre H. Woerlee, all of Eindhoven (NL)

(73) Assignee: U.S. Phillips Corporation, New York, NY (US)

( * ) Notice: Subject to any disclaimer, the term of this patent is extended or adjusted under 35 U.S.C. 154(b) by 0 days.

(21) Appl. No.: 09/064,207

(22) Filed: Apr. 22, 1998

(30) Foreign Application Priority Data

May 23, 1997 (EP) .................................................. 97201562

(51) Int. Cl.[7] .................................................. H01L 21/336
(52) U.S. Cl. .......................... 438/309; 438/305; 438/564; 438/923
(58) Field of Search .................................. 438/301, 303, 438/304, 305, 648, 682, 683, 933, 564, 558, 923

(56) References Cited

U.S. PATENT DOCUMENTS

| | | | |
|---|---|---|---|
| 5,212,110 | * | 5/1993 | Pfiester et al. .......................... 438/222 |
| 5,238,859 | * | 8/1993 | Kamijo et al. .......................... 438/304 |
| 5,281,552 | * | 1/1994 | King et al. .............................. 437/131 |
| 5,391,508 | | 2/1995 | Matsuoka et al. ....................... 437/41 |
| 5,571,744 | * | 11/1996 | Demirlioglu et al. ................... 438/217 |
| 5,637,514 | * | 6/1997 | Jeng et al. ............................. 438/163 |
| 5,654,212 | * | 8/1997 | Jang ....................................... 438/231 |
| 5,710,054 | * | 1/1998 | Gardner et al. ........................ 438/304 |
| 5,874,343 | * | 2/1999 | Fulford, Jr. et al. .................. 438/305 |
| 5,913,123 | * | 6/1999 | Lin et al. ............................... 438/299 |
| 6,087,239 | * | 7/2000 | Juengling .............................. 438/305 |

\* cited by examiner

Primary Examiner—Olik Chaudhuri
Assistant Examiner—Kurt Eaton
(74) Attorney, Agent, or Firm—John Vodopia

(57) ABSTRACT

A method of manufacturing a semiconductor device with a MOS transistor having an LDD structure. A gate dielectric (6) and a gate electrode (7, 8) are formed on a surface (5) of a silicon substrate (1). The surface adjacent the gate electrode is then exposed, and a layer of semiconductor material (10) is formed on an edge (9) of the surface adjoining the gate electrode. Ions (13, 14) are subsequently implated, with the gate electrode and the layer of semiconductor material acting as a mask. Finally, a heat treatment is carried out whereby a source zone (16, 17) and a drain zone (18, 19) are formed through activation of the implanted ions and through diffusion of atoms of a dopant from the layer of semiconductor material. The portions (b) of these zones formed by diffusion are weakly doped here and lie between the more strongly doped portions (a) formed through activation of implanted ions and the channel zone (20, 21). An LDD structure has thus been formed. In the method, a layer of semiconductor material formed by $Si_{1-x}Ge_x$, $0.1<x<0.6$, is provided on the edge adjoining the gate electrode. This layer is etched away selectively after the heat treatment. The formation of parasitic drain-gate capacitances is counteracted thereby.

17 Claims, 4 Drawing Sheets

MANUFACTURE OF A SEMICONDUCTOR DEVICE WITH A MOS TRANSISTOR HAVING AN LDD STRUCTURE USING SIGE SPACERS

BACKGROUND OF THE INVENTION

The invention relates to a method of manufacturing a semiconductor device with a MOS transistor, by which method a gate dielectric and a gate electrode are formed on a surface of a silicon substrate, whereupon the surface next to the gate electrode is exposed, a layer of semiconductor material is formed in the silicon substrate on an edge of the surface adjoining the gate electrode with the gate electrode and the layer of semiconductor material acting as a mask, ions are implanted, and a heat treatment is carried out so as to form a source zone and a drain zone through activation of the implanted ions and through diffusion of atoms of a dopant from the layer of semiconductor material.

The source and drain zones of the MOS transistor are formed during the heat treatment. One portion of each of these zones is formed through activation of implanted ions and another portion through diffusion of atoms of a dopant from the layer of semiconductor material. These portions are simultaneously formed during the heat treatment, the former portion lying next to the layer of semiconductor material and the latter portion merging into the former and lying below the layer of semiconductor material. The quantity of dopant provided by implantation and the quantity of dopant provided by diffusion can be adjusted independently of one another. This is done as follows in practice: the former portions of the source and drain zones are comparatively strongly doped, and the second portions comparatively weakly. The portion lying below the gate electrode, which is not doped here, forms the channel zone of the MOS transistor. The comparatively weakly doped portion is accordingly present between the comparatively strongly doped portion and the channel zone. Such a structure is sometimes referred to as LDD (lightly doped drain) structure.

The formation of the comparatively shallow and weakly doped portion of the source and drain zones through diffusion from the layer of semiconductor material also renders it possible to form a very shallow zone. Zones having a depth of less than 10 nm can thus be realized, which is practically impossible by means of ion implantation followed by a heat treatment.

U.S. Pat. No. 5,391,508 discloses a method of the kind mentioned in the opening paragraph whereby a layer of semiconductor material consisting of silicon is provided on the edge of the surface which adjoins the gate electrode. To achieve this, a side wall insulation is first formed on the gate electrode after the surface next to the gate electrode has been exposed, i.e. a layer of insulating material is deposited, whereupon the surface next to the gate electrode is again exposed by means of an anisotropic etching treatment, such that the side wall insulation remains. A silicon layer is subsequently deposited and then subjected to an anisotropic etching treatment which is stopped when a comparatively thin silicon layer is still present on the gate electrode and on the surface. A comparatively thick silicon layer is still present on the side wall of the gate electrode then. Subsequently, the assembly is subjected to a thermal oxidation treatment whereby the deposited silicon is oxidized so far that it is completely converted into silicon oxide on the gate electrode and on the surface. A layer of silicon covered by silicon oxide then remains on the side wall of the gate electrode and on the edge of the surface adjoining the gate electrode. The silicon layer covered with silicon oxide is subsequently doped by means of an oblique implantation.

Not only does the known method comprise many process steps which are difficult to control, but it has the particular disadvantage that the silicon layer covered with silicon oxide remains present in the MOS transistor. This doped layer connected to the source or drain zone is insulated from the gate electrode by a thin silicon oxide layer. As a result of this, parasitic capacitances arise of which especially the gate-drain capacitance is disadvantageous to the operation of the MOS transistor.

Neither is it possible to remove the silicon layer covered with silicon oxide at the area of the MOS transistor. After etching away of the silicon oxide layer formed by thermal oxidation, in fact, both the silicon layer on the edge adjoining the gate electrode and the silicon of the substrate next to this edge would be exposed. This means that, when the silicon layer is etched away from the edge adjoining the gate electrode, the same quantity of silicon would be removed from the substrate situated next to the edge.

In practice, the gate electrode forms a conductor track having a beginning and an end. The silicon layer covered with silicon oxide is formed also on this beginning and this end. This silicon layer forms an electrical connection between the silicon layer covered with silicon oxide and formed on the side walls of the gate electrode. At one side of the gate this silicon layer is connected to the source, at the other side to the drain of the MOS transistor. Thus a short-circuit between source and drain is formed. This short-circuit can only be eliminated by means of additional process steps. The beginning and end have to be provided, for example, on a layer of a material other than silicon, and portions of the gate electrode lying on silicon have to be protected with a photoresist mask during the removal of the silicon covered with silicon oxide.

SUMMARY OF THE INVENTION

The invention has for its object to provide a method which is free from the above disadvantages. The method is for this purpose characterized in that a layer of semiconductor material consisting of $Si_{1-x}Ge_x$, with $0.1<x<0.6$, is provided on the edge immediately next to the gate electrode, which layer is etched away selectively after the heat treatment.

A layer of $Si_{1-x}Ge_x$, with $0.1<x<0.6$, is as suitable for use as a ; diffusion source for the formation of the weakly doped portions of the source and drain zones as is silicon. In addition, the layer can be etched away with a very high selectivity with respect to materials such as silicon, silicon oxide, silicon nitride. The layer of $Si_{1-x}Ge_x$, with $0.1<x<0.6$, can be removed without damage to subjacent and adjacent layers after the heat treatment. Neither is it necessary to provide a side wall insulation on the gate electrode before the layer is provided. The parasitic capacitances and short-circuits mentioned above are not created.

The layer of $Si_{1-x}Ge_x$, with $0.1<x<0.6$, may be formed on the edge of the surface adjoining the gate electrode in that a layer is deposited and an etching treatment is subsequently carried out, as in the known method. Said etching treatment may now be continued until the surface of the gate electrode and the surface of the silicon substrate have become exposed again. The edge adjoining the gate electrode is then given a width which is practically equal to the thickness of the deposited layer of $Si_{1-x}Ge_x$. It is alternatively possible, however, to provide a mask on the deposited layer before the etching treatment, in which case the width of the edge is defined by the dimensions of the mask.

Preferably, the layer of semiconductor material consisting of $Si_{1-x}Ge_x$, with $0.1<x<0.6$, is provided in non-monocrystalline form, which may be a polycrystalline or an amorphous form. Atoms of the dopant diffuse much more quickly through non-monocrystalline semiconductor material, owing to the presence of grain boundaries, than through monocrystalline semiconductor material, it is achieved in this manner that the heat treatment can be carried out in a short time in a usual RTP (Rapid Thermal Processing) reactor. Atoms of the dopant are present then at the boundary surface of Si and $Si_{1-x}Ge_x$ throughout the entire heat treatment. Atoms provided at the surface of the $Si_{1-x}Ge_x$ layer, for example by means of implantation, also easily reach said boundary surface.

A layer of a metal silicide is formed in practice on top of the gate electrode and the source and drain zones to render possible a low-ohmic contacting of the gate electrode and source and drain zones. This is done by depositing a layer of metal, for example titanium, and by having the metal react with the subjacent silicon after that by means of a heat treatment. To prevent the formation of short-circuits between the gate electrode and the source and drain zone during this, preferably, a side-wall insulator is formed on the side wall of the gate electrode and the edge of the surface adjoining the gate electrode after the layer of semiconductor material has been etched away. This may be done in that a layer of insulating material is deposited and an anisotropic etching treatment is subsequently carried out until the layer has been removed from the surface of the gate electrode and from the surface of the silicon substrate, said side-wall insulator remaining behind then. It is also possible to provide a mask after the deposition of the layer of insulating material and to carry out an etching treatment. In the former case a side-wall insulator is formed with a thickness equal to the thickness of the deposited layer, in the latter case with a width which is determined by dimensions of the mask.

It is not necessary to provide an insulator on the side wall of the gate electrode before the layer of semiconductor material is provided, as in the known method described. Preferably, however, a thermal oxidation is carried out before the layer of semiconductor material is provided whereby a 2 to 10 nm thick oxide layer is formed on the gate electrode and on the surface next to the gate electrode. After its formation, the gate electrode has a rectangular cross-section in practice with straight-angled corners at its lower side. Undesirably strong electric fields may arise at these corners during operation of the MOS transistor, which may damage the gate dielectric. Said oxidation does not create an insulating layer which effectively insulates the gate electrode, but it does round off the straight angle referred to above, so that the occurrence of said electric fields is counteracted.

The thermal oxidation may be carried out before or after the surface next to the gate electrode has been exposed by the removal of the gate dielectric. Said straight angle is rounded off in both cases. Preferably, the oxide layer is provided through thermal oxidation to a thickness smaller than that of the gate dielectric after the surface next to the gate electrode has been exposed. An equally thick layer of silicon oxide is also formed on the surface of the silicon substrate during this oxidation. The diffusion by means of which the weakly doped portions of the source and drain zones are formed may take place through this comparatively thin layer of silicon oxide. Since the layer is thinner than the gate dielectric layer, the channel zone of the MOS transistor is practically not doped from the gate electrode.

Doping of the channel zone from the gate electrode can be entirely avoided when, before the layer of semiconductor material is provided, the oxide layer is subjected to an anisotropic etching treatment until the surface next to the gate electrode has become exposed. The surface of the substrate is exposed again, while the rounded corner formed at the lower side of the gate electrode remains covered with insulating material. The diffusion of atoms of the dopant from the layer of semiconductor material may then be carried out such that the channel zone is not doped from the gate electrode.

In practice, a semiconductor device will not comprise a single MOS transistor but a very large number thereof, and in addition of different types. A MOS transistor having a p-type channel zone and n-type source and drain zones forms an N-channel transistor, a MOS transistor having an n-type channel zone and p-type source and drain zones forms a P-channel transistor. Source and drain zones of different conductivity types should accordingly be made in order to realize different types.

Preferably, the layer of semiconductor material is not provided with atoms of the dopant until after this layer has been formed on the edge of the surface situated immediately next to the gate electrode. The dopant is not provided in the layer of semiconductor material until after this layer has been etched into a pattern. A photoresist mask is necessary in that case for the formation of the one type of MOS transistor which covers regions where transistors of the one type are to be realized and which leaves regions open where transistors of the other type are to be realized. It is possible by means of this mask both to provide a dopant in the layer of semiconductor material and to implant ions into the silicon substrate. A different, complementary photoresist mask is necessary for forming the MOS transistors of the other type. These two mutually complementary photoresist masks can suffice for the formation of the source and drain zones of both types of MOS transistors. If the layer of semiconductor material were provided with atoms of the dopant immediately after deposition and before etching, the two complementary photoresist masks would have to be provided twice. This is because the implantation can only take place after the layer of semiconductor material has been etched.

A very simple method is obtained when, during the implantation of ions into the surface for forming the source contact zone and a drain contact zone, ions are at the same time implanted into the layer of semiconductor material on the edge immediately next to the gate electrode.

BRIEF DESCRIPTION OF THE DRAWINGS

The invention will be explained in more detail below by way of example with reference to a drawing, in which.

DESCRIPTION OF THE PREFERRED EMBODIMENTS

Figure 1:
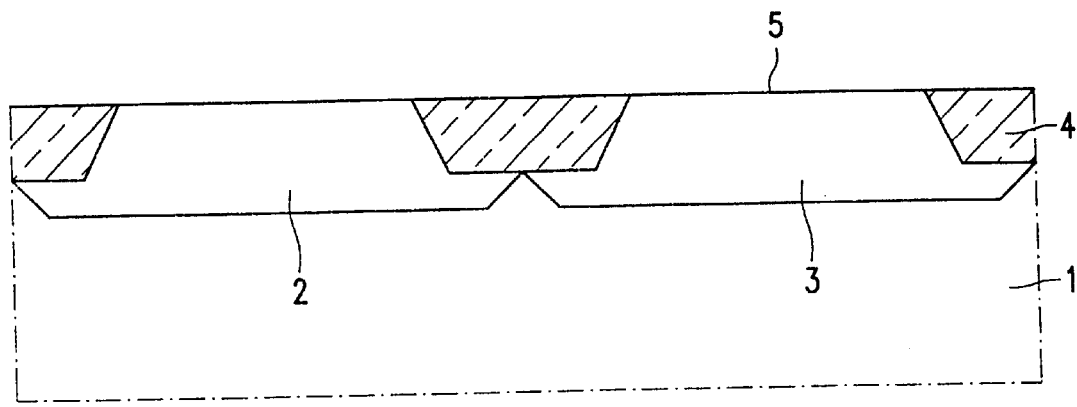
FIGS. 1 to 9 diagrammatically and in cross-section show a few stages in the manufacture of a first embodiment of a semiconductor device made by the method according the invention, and FIGS. 10 to 12 diagrammatically and in cross-section show a few stages in the manufacture of a second embodiment of a semiconductor device made by the method according to the invention.
Figure 2:
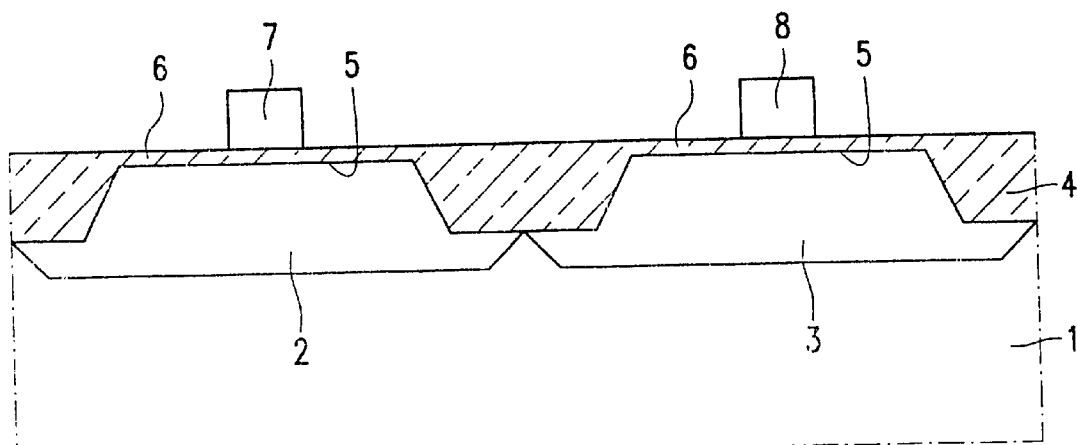

The manufacture of a first embodiment of a semiconductor device with MOS transistors as shown in FIGS. 1 to 9 starts with a silicon substrate 1 in which p-type active regions 2 for N-channel MOS transistors and n-type active regions 3 for P-channel MOS transistors are formed in a usual manner. These regions 2, 3 are insulated from one another by field insulation regions 4. These field insulation regions 4 may be formed by local oxidation of the silicon substrate 1, or alternatively through etching of grooves into the silicon substrate which are subsequently filled up with insulating material. In practice, a semiconductor device will comprise very many of such mutually insulated regions 2, 3, but only one of each type has been drawn for simplicity's sake.

A gate dielectric 6 is formed on the surface 5 of a silicon substrate 1. This is an approximately 4 nm thick layer of silicon oxide in this example, obtained through thermal oxidation of the silicon substrate. Gate electrodes 7 and 8 of polycrystalline silicon are subsequently formed on the layer of gate dielectric 6 in a usual manner. These electrodes have a width and a height of, for example, 150 nm.

After the gate electrodes 7, 8 have been formed, the surface 5 of the substrate 1 is exposed next to the gate electrodes 7, 8 through the removal of the layer of gate dielectric 6. A layer of semiconductor material 10 is then formed on an edge 9 of the surface 5 adjoining the gate electrodes 7, 8. This is done in the present example through deposition of a layer of semiconductor material 11 and through a subsequent anisotropic etching treatment which is carried out until the gate electrodes 7, 8 and the surface 5 have become exposed again.

Subsequently, a photoresist mask 12 is provided which leaves the active regions 2, where the N-channel MOS transistors are to be formed, uncovered, and which covers the active regions 3 where the P-channel MOS transistors are to be formed. Ions of an n-type dopant are now implanted into the active regions 2 of the silicon substrate 1, while the gate electrodes 7 and the layer of semiconductor material 10 act as a mask, as indicated diagrammatically with broken line 13. Ions are also implanted into the layer of semiconductor material 10 adjoining the gate electrodes 7 during this. After the implantation, the photoresist mask 12 is removed and a complementary photoresist mask 14 is provided, leaving the active regions 3, where the P-channel MOS transistors are to be formed, uncovered, and covering the active regions 2 where the N-channel MOS transistors are to be formed. Ions of a p-type dopant are now implanted into the active regions 3 of the silicon substrate 1, with the gate electrodes 8 and the layer of semiconductor material 10 acting as a mask, as indicated diagrammatically with broken line 15. Ions are also implanted into the layer of semiconductor material 10 adjoining the gate electrodes 8 during this. The photoresist mask 14 is removed after this implantation.

After the implantations 13, 15, a heat treatment is carried out whereby source zones 16, 17 and drain zones 18, 19 are formed through activation of the implanted ions 13, 15 and through diffusion of atoms of a dopant from the layer of semiconductor material 10. Portions referenced a of these zones 16, 17, 18, 19 are formed through activation of implanted ions 12, 14, and other portions referenced b through diffusion of atoms of a dopant from the layer of semiconductor material 10. These portions are formed simultaneously during the heat treatment, the former portion a lying adjacent the layer of semiconductor material 10 each time, and the second portion b merging into the former and lying below the layer of semiconductor material 10. The quantity of dopant provided through implantation and the quantity of dopant provided through diffusion have been chosen such that the former portions a of the source and drain zones are comparatively strongly doped and the latter portions b comparatively weakly. The portion 20, 21 situated below the gate electrode and not doped during this forms the channel zone of the MOS transistor. The comparatively weakly doped portion b is accordingly present between the comparatively strongly doped portion a and the channel zone 20, 21. Such a structure is sometimes referred to as LDD (lightly doped drain) structure.

Figure 3:
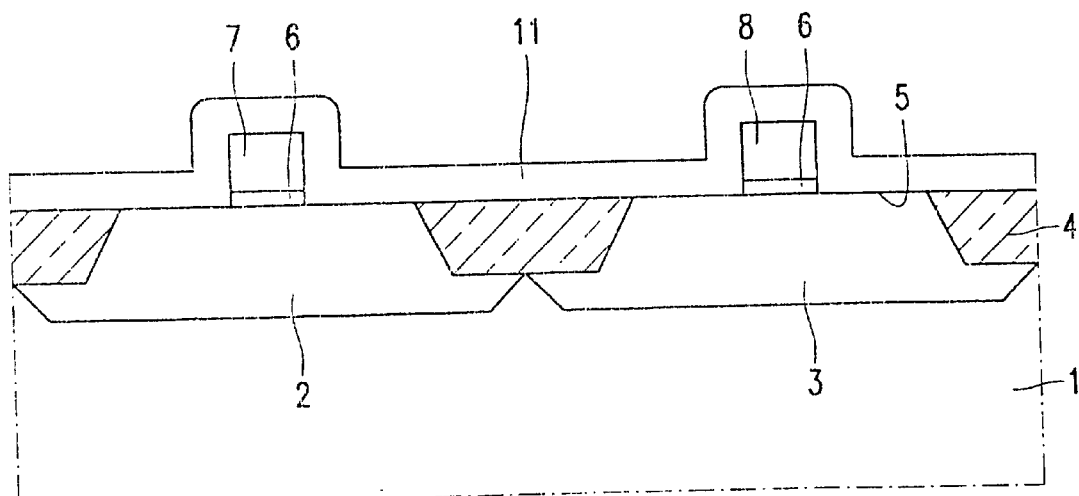
Figure 4:
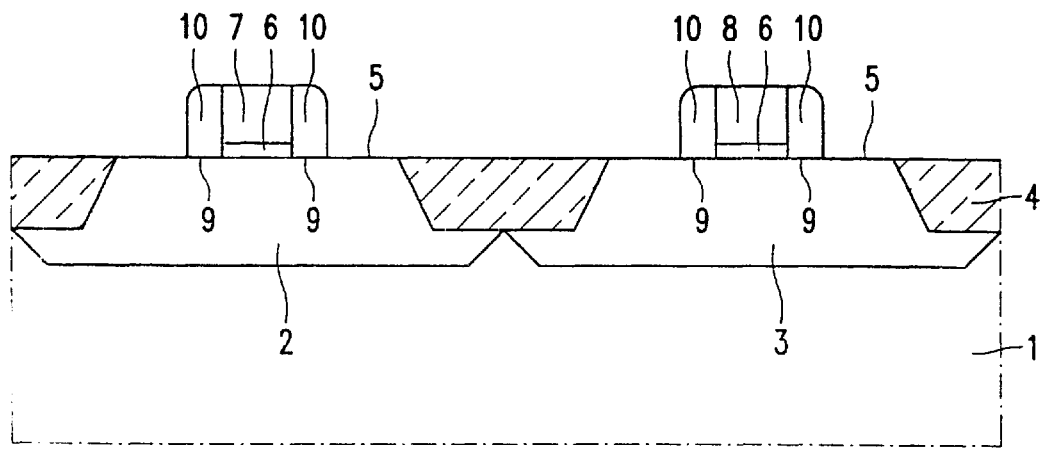
Figure 5:
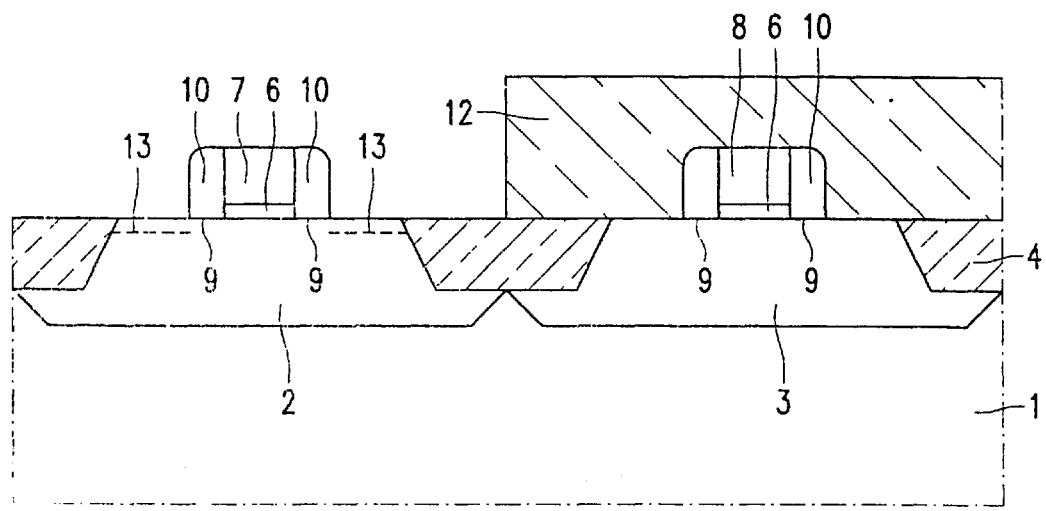
Figure 6:
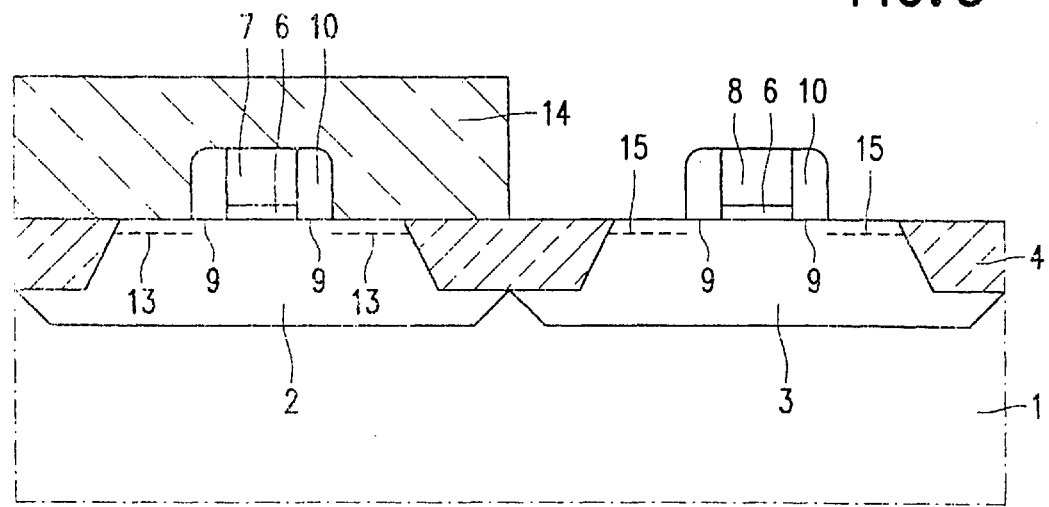
Figure 7:
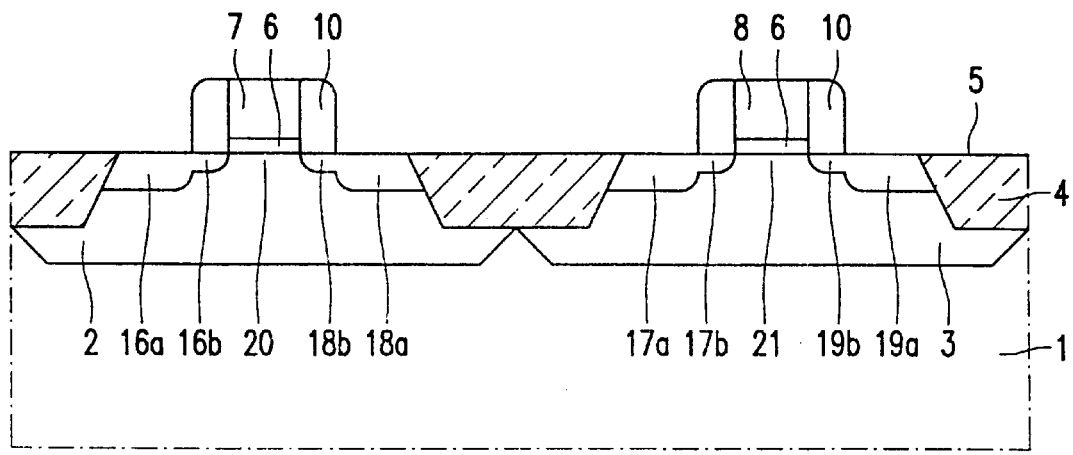
Figure 8:
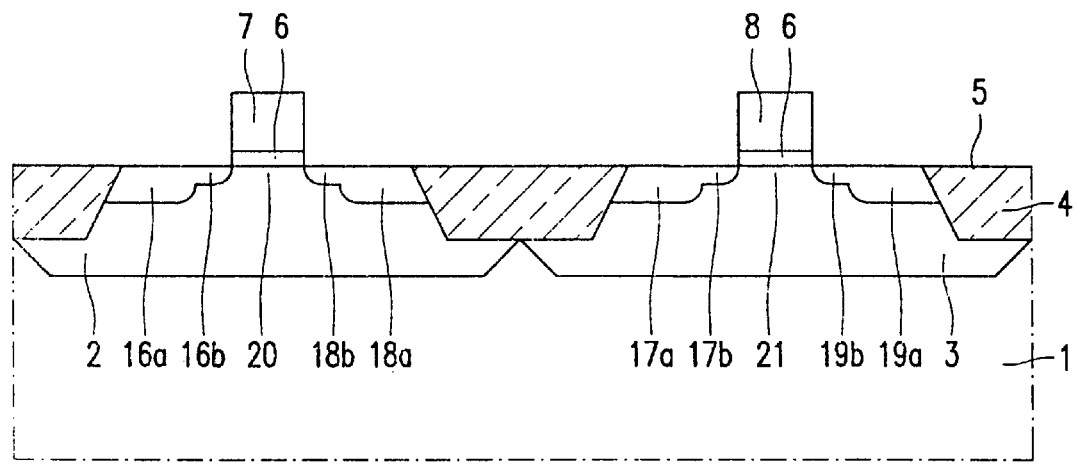
Figure 9:
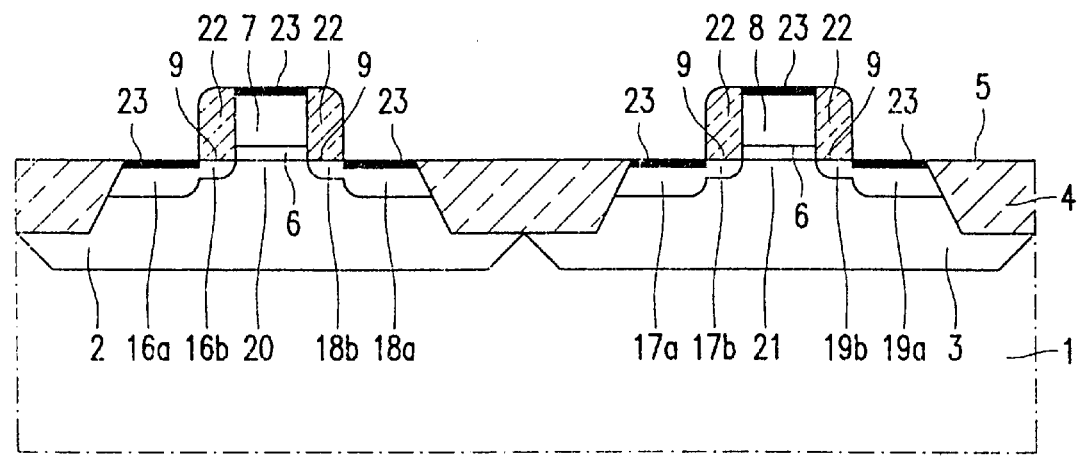

According to the invention, a layer of semiconductor material 10 consisting of $Si_{1-x}Ge_x$, with $0.1<x<0.6$, is provided on the edge 9 adjoining the gate electrodes 7, 8. As FIG. 3 shows, a layer 11 of $Si_{1-x}Ge_x$ is for this purpose deposited by means of a usual LPCVD (low-pressure chemical vapor deposition) process from a gas mixture comprising $SiH_4$ and $GeH_4$. Subsequently, an anisotropic etching treatment is carried out with ions from a plasma formed in a gas mixture comprising $Cl_2$, HBr, and $O_2$, whereby the $Si_{1-x}Ge_x$ can be etched away highly selectively with respect to silicon and silicon oxide. The layer 10 is etched away selectively, as shown in FIG. 8, in an etching bath containing $NH_4OH$ and $H_2O_2$ and water after the heat treatment in which the source zones 16, 17 and the drain zones 18, 19 are formed.

The layer 10 of $Si_{1-x}Ge_x$, with $0.1<x<0.6$, which can serve as a satisfactory diffusion source for forming the weakly doped portions b of the source zones 16, 17 and the drain zones 18, 19, can be etched away with a very high degree of selectivity with respect to materials such as silicon, silicon oxide, and silicon nitride, for example in the etching bath indicated above. The layer 10 of $Si_{1-x}Ge_x$, with $0.1<x<0.6$, can be removed from subjacent and adjacent layers without damage after the heat treatment.

The layer 10 of $Si_{1-x}Ge_x$, with $0.1<x<0.6$, can be formed on the edge 9 adjoining the gate electrode in the manner described above. The edge 9 adjoining the gate electrode 7, 8 is then given a width which is practically equal to the thickness of the deposited layer 9 of $Si_{1-x}Ge_x$. It is alternatively possible, however, to provide a mask (not shown) on the deposited layer 11 before the etching treatment, in which case the width of the edge 9 is defined by the dimensions of the mask.

Preferably, the layer 10 is provided in a non-monocrystalline form. This is achieved in that the LPCVD process referred to above is carried out at a comparatively low temperature; the silicon substrate is heated to a temperature, for example, in a range from 400 to 500° C.

Atoms of the dopant diffuse much more quickly through non-monocrystalline semiconductor material, owing to the presence of grain boundaries, than through monocrystalline semiconductor material. It is achieved thereby that atoms of the dopant are present at the boundary surface between Si and $Si_{1-x}Ge_x$ throughout the entire heat treatment, so that the heat treatment can be carried out in a short period in a usual RTP (Rapid Thermal Processing) reactor. Atoms provided at the surface of the $Si_{1-x}Ge_x$ layer, for example through implantation, also easily reach the active regions 2, 3 of the silicon substrate 1.

After the source zones 16, 17 and the drain zones 18, 19 have been formed, and after the layer of semiconductor material 10 has been etched away, a side-wall insulator 22 is formed on the side walls of the gate electrodes 7, 8 and on the edge 9 of the surface 5 which adjoins the gate electrode. This is done in the present case in that a layer of insulating material (not shown) is deposited and subsequently an anisotropic etching treatment is carried out until the layer has been removed from the gate electrode 7, 8 and from the surface 5 of the silicon substrate 1, so that said side-wall insulator 22 remains behind. It is alternatively possible to provide a photoresist mask after the deposition of the layer of insulating material and to carry out an etching treatment. In the former case, an insulator is formed having a width which is equal to the thickness of the deposited layer, in the latter case having a width which is defined by the dimensions of the photoresist mask.

To render possible a low-ohmic contacting of the gate electrodes 7, 8, of the source zones 16, 17, and of the drain zones 18, 19, a layer 23 of a metal silicide is formed over the gate electrodes 7, 8, the source zones 16, 17, and the drain zones 18, 19. This is done in that a layer of metal (not shown), for example titanium, is deposited and is subsequently made to react with the subjacent silicon by means of a heat treatment, whereupon any metal which has not reacted with silicon is removed. The side-wall insulation 22 prevents the creation of short-circuits between gate electrodes 7, 8, source zones 16, 17, and drain zones 18, 19 during this.

Figure 10:
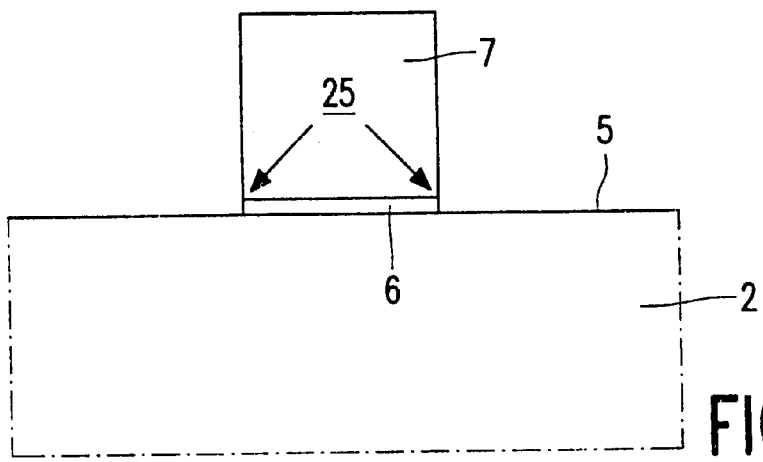
Figure 11:
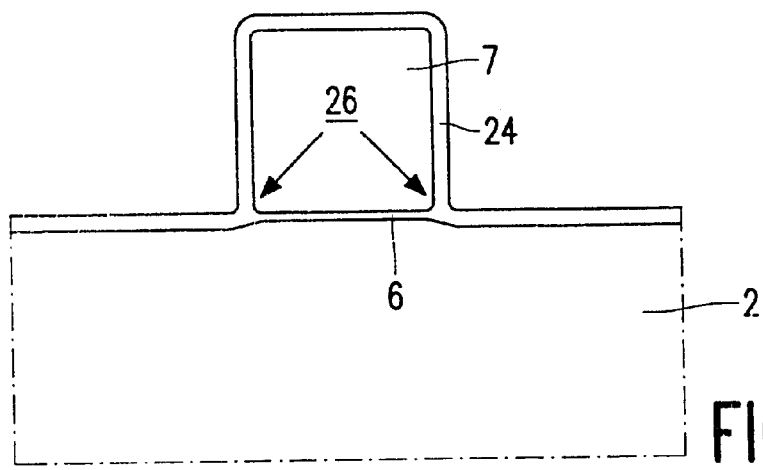
Figure 12:
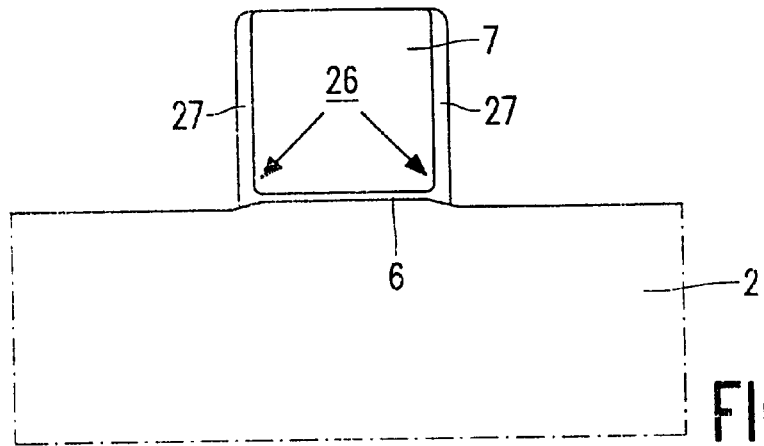

FIGS. 10 to 12 show a few stages in the manufacture of a second embodiment of a semiconductor device which proceeds in the same manner as described with reference to FIGS. 1 to 9, except for the differences shown in these Figures. FIGS. 10 to 12 only show a detail, i.e. one of the gate electrodes 7 and part of the active region 2. In this embodiment, a thermal oxidation is carried out before the layer of semiconductor material 10 is formed on the edge 9 adjoining the gate electrode 7, 8, so that a 2 to 10 nm thick layer of oxide 24 is formed on the gate electrode 7, 8 and on the surface adjacent the gate electrode., After the gate electrode 7 has been formed, it will show a rectangular cross-section in practice, with straight-angled corners 25 at its lower side. Undesirably strong electric fields may arise at such a corner during operation of the MOS transistor, whereby the gate dielectric 6 may become damaged. Said oxidation does not form an insulating layer which effectively insulates the gate electrode, but it does change said straight angle 25 into a rounded angle 26, so that the occurrence of said electric fields is counteracted.

The thermal oxidation may be carried out before or after the surface 5 next to the gate electrode 7, 8 has been exposed through the removal of the gate dielectric 6. Said straight angle 25 is rounded off in either case. Preferably, the layer of oxide 24 is provided by thermal oxidation after the surface 5 next to the gate electrode 7, 8 has been exposed and to a thickness which is smaller than that of the gate dielectric 6. An equally thick layer of silicon oxide is also formed on the surface 5 of the silicon substrate 1 during this oxidation step. The diffusion whereby the weakly doped portions b of the source zones 16, 17 and the drain zones 18, 19 are formed can take place through this comparatively thin layer of silicon oxide. Since the layer 26 is thinner than the gate dielectric layer 6, the channel zone of the MOS transistor is practically not doped from the gate electrode.

Doping of the channel zone from the gate electrode can be entirely avoided if, as shown in FIG. 12, the oxide layer 24 is subjected to an anisotropic etching treatment, before the layer of semiconductor material 11 is provided, until the surface 5 next to the gate electrode 7, 8 has become exposed. The surface 5 of the substrate is exposed again, whereas the rounded angle 26 formed at the lower side of the gate electrode 7, 8 remains covered with insulating material 27. The diffusion of atoms of the dopant from the layer of semiconductor material 10 may then be carried out such that the channel zone 20, 21 is not doped from the gate electrode 7, 8.

In the embodiments described, the layer of semiconductor material 10 is not provided with atoms of the dopant until after this layer has been formed on the edge of the surface situated immediately adjacent the gate electrode. The dopant is not provided in the layer of semiconductor material 11 until after this layer has been etched into a pattern. Two mutually complementary photoresist masks 12, 14 are necessary in that case for the formation of the two types of MOS transistors described. If the layer of semiconductor material 11 were provided with atoms of a dopant immediately after deposition but before etching, the two complementary photoresist masks 12, 14 would each have to be provided twice. This is because the implantation steps cannot be carried out until after the layer of semiconductor material 11 has been etched.

In the embodiments described, ions are implanted into the layer of semiconductor material 10 on the edge 9 immediately next to the gate electrodes 7, 8 during the implantation of ions 13, 15 into the surface 5. The doping strengths of the weakly doped portions b of the source zones 16, 17 and drain zones 18, 19 can then be determined by the time and temperature of the heat treatment.

In the embodiments, the implantation 13 is carried out into the active region 2 and the layer of semiconductor material 10 by means of As ions which are implanted with a dose of $2\times10^{15}$ to $1\times10^{16}$ atoms per $cm^2$, with the photoresist mask 12 acting as a mask. Under masking of the photoresist mask 14, the implantation 15 is carried out with B ions, which are also implanted with a dose of $2\times10^{15}$ to $1\times10^{16}$ atoms per $cm^2$. After a heat treatment of 5 to 60 seconds at 1000° C., weakly doped portions b of the source zones 16, 17 and the drain zones 18, 19 are then formed, having a doping concentration of approximately $10^{19}$ atoms per cc, and strongly doped portions a having a doping concentration of approximately $10^{20}$ atoms per cc.

What is claimed is:

1. A method of manufacturing a semiconductor device with a MOS transistor, said method comprising:

forming a gate dielectric and a gate electrode on a surface of a silicon substrate, the gate dielectric and the gate electrode having sidewalls aligned with each other;

exposing the surface of the substrate next to the gate electrode;

forming a layer of semiconductor material consisting of $Si_{1-x}Ge_x$ with $0.1<x<0.6$, on the sidewalls of the gate dielectric and the gate electrode, the layer of semiconductor material extending to the surface of the substrate;

implanting ions with the gate electrode and the layer of semiconductor material acting as a mask carrying out a heat treatment so as to form a source zone and a drain zone through activation of the implanted ions and through diffusion of atoms of a dopant from the layer of semiconductor material; consisting of $Si_{1-x}Ge_x$, with $0.1<x<0.6$; and, after the heat treatment, selectively etching away the layer of semiconductor material consisting of $Si_{1-x}Ge_x$, with $0.1<x<0.6$ to expose the sidewalls and the surface of the substrate.

2. A method as claimed in claim 1, characterized in that the layer of semiconductor material consisting of $Si_{1-x}Ge_x$, with $0.1<x<0.6$, is provided in non-monocrystalline form.

3. A method as claimed in claim 1, characterized in that a side-wall insulator is formed on the side wall of the gate electrode and the edge of the surface adjoining the gate electrode after the layer of semiconductor material has been etched away.

4. A method as claimed in claim 1, characterized in that said step of forming a gate dielectric and a rate electrode provides a gate electrode with a rectangular cross section with sharp corners at its side adjoining the gate dielectric; and said method further including carrying out a thermal oxidation out before the layer of semiconductor material is provided whereby a 2 to 10 nm thick oxide layer is formed on the gate electrode and on the surface next to the gate electrode to convert said sharp corners to rounded corners.

5. A method as claimed in claim 4, characterized in that the oxide layer is provided through thermal oxidation to a thickness smaller than that of the gate dielectric after the surface next to the gate electrode has been exposed.

6. A method as claimed in claim 5, characterized in that, before the layer of semiconductor material is provided, the oxide layer is subjected to an anisotropic etching treatment until the surface next to the gate electrode has become exposed.

7. A method as claimed in claim 1, characterized ill that the layer of semiconductor material is not provided with atoms of the dopant until after this layer has been formed on the edge of the surface situated immediately next to the gate electrode.

8. A method as claimed in claim 7, characterized in that, during the implantation of ions into the surface for forming the source contact zone and a drain contact zone, ions are at the same time implanted into the layer of semiconductor material on the edge immediately next to the gate electrode.

9. A method as claimed in claim 2, characterized in that a side-wall insulator is formed on the side wall of the gate electrode and the edge of the surface adjoining the gate electrode after the layer of semiconductor material has been etched away.

10. A method as claimed in claim 2, characterized in that a thermal oxidation is carried out before the layer of semiconductor material is provided whereby a 2 to 10 nm thick oxide layer is formed on the gate electrode and on the surface next to the gate electrode.

11. A method as claimed in claim 3, characterized in that a thermal oxidation is carried out before the layer of semiconductor material is provided whereby a 2 to 10 nm thick oxide layer is formed on the gate electrode and on the surface next to the gate electrode.

12. A method as claimed in claim 4, characterized in that, before the layer of semiconductor material is provided, the oxide layer is subjected to an anisotropic etching treatment until the surface next to the gate electrode has become exposed.

13. A method as claimed in claim 2, characterized in that the layer of semiconductor material is not provided with atoms of the dopant until after this layer has been formed on the edge of the surface situated immediately next to the gate electrode.

14. A method as claimed in claim 3, characterized in that the layer of semiconductor material is not provided with atoms of the dopant until after this layer has been formed on the edge of the surface situated immediately next to the gate electrode.

15. A method as claimed in claim 4, characterized in that the layer of semiconductor material is not provided with atoms of the dopant until after this layer has been formed on the edge of the surface situated immediately next to the gate electrode.

16. A method as claimed in claim 5, characterized in that the layer of semiconductor material is not provided with atoms of the dopant until after this layer has been formed on the edge of the surface situated immediately next to the gate electrode.

17. A method as claimed in claim 6, characterized in that the layer of semiconductor material is not provided with atoms of the dopant until after this layer has been formed on the edge of the surface situated immediately next to the gate electrode.

* * * * *